United States Patent
Komatsu et al.

(10) Patent No.: US 10,622,215 B2
(45) Date of Patent: Apr. 14, 2020

(54) CUTTING APPARATUS AND WAFER PROCESSING METHOD

(71) Applicant: DISCO CORPORATION, Tokyo (JP)

(72) Inventors: Atsushi Komatsu, Tokyo (JP); Kokichi Minato, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 16/050,470

(22) Filed: Jul. 31, 2018

(65) Prior Publication Data

US 2019/0051532 A1 Feb. 14, 2019

(30) Foreign Application Priority Data

Aug. 9, 2017 (JP) .................................. 2017-153874

(51) Int. Cl.
    *H01L 21/304* (2006.01)
    *H01L 21/67* (2006.01)
    *H01L 21/683* (2006.01)
    *H01L 21/66* (2006.01)

(52) U.S. Cl.
    CPC ...... *H01L 21/304* (2013.01); *H01L 21/67092* (2013.01); *H01L 21/67259* (2013.01); *H01L 21/6838* (2013.01); *H01L 22/12* (2013.01); *H01L 22/20* (2013.01)

(58) Field of Classification Search
    None
    See application file for complete search history.

(56) References Cited

U.S. PATENT DOCUMENTS

2006/0079155 A1* 4/2006 Nakamura .............. B24B 7/228
                                                            451/41

FOREIGN PATENT DOCUMENTS

| JP | 2014033152 A | | 2/2014 |
|----|--------------|---|--------|
| JP | 2015023239 A | * | 2/2015 |

* cited by examiner

*Primary Examiner* — Bo B Jang
(74) *Attorney, Agent, or Firm* — Greer Burns & Crain Ltd.

(57) ABSTRACT

A cutting apparatus includes a line sensor unit that applies a laser beam in a band shape elongated in a radial direction of a wafer to a region inclusive of a peripheral portion of the wafer held on a chuck table, and detects reflected light, and an information calculation section that calculates the position of the wafer and the height of the front surface of the wafer from the reflected light of the laser beam detected by the line sensor unit in a state in which the chuck table is rotated before the wafer is cut to form a stepped portion, and that calculates the width and the height of the stepped portion from the reflected light of the laser beam detected by the line sensor unit after the wafer is cut to form the stepped portion.

3 Claims, 6 Drawing Sheets

CUTTING APPARATUS AND WAFER PROCESSING METHOD

BACKGROUND OF THE INVENTION

Field of the Invention

The present invention relates to a cutting apparatus for cutting a wafer and a wafer processing method in which the cutting apparatus is used.

Description of the Related Art

In recent years, for realizing small-type lightweight devices, processing for thinning a wafer formed of such a material as silicon has come to be conducted more frequently. For instance, a device such as an integrated circuit (IC) is formed in each of regions of a wafer partitioned by division lines (streets), then the wafer is thinned by such a method as grinding and is divided along the division lines, whereby device chips corresponding to the devices are obtained.

Of the wafer used for manufacture of the device chips as above, a peripheral portion is normally chamfered in order to prevent chipping or cracking from occurring due, for example, to a shock exerted on the wafer during carrying thereof. However, when the thus chamfered wafer is thinned by grinding or the like method, the peripheral edge of the wafer becomes sharp like a knife edge and brittle, leading to rather easier occurrence of chipping or cracking.

In view of this problem, there has been proposed a processing method called edge trimming in which the chamfered portion is cut and removed before grinding (see, for example, Japanese Patent Laid-Open No. 2014-33152). When a cutting blade is made to cut into the wafer from the front surface side of the wafer to preliminarily cut and remove the chamfered portion, it is ensured that even if the wafer is ground from the back surface side, the peripheral edge of the wafer is prevented from becoming sharp like a knife edge and brittle.

SUMMARY OF THE INVENTION

In the edge trimming, for example, the cutting blade is made to cut into the chamfered portion of the wafer held by the chuck table from the front surface side, and, in this condition, the chuck table is rotated. For appropriate cutting and removal of the chamfered portion, therefore, it has been necessary to acquire information on the position of the wafer relative to the chuck table and on the position of the cutting blade relative to the wafer, and to accurately adjust the positional relations of them.

In addition, there are cases where it is desired to acquire information related to the width and the height of a step (stepped portion) formed by the cutting and removal of the chamfered portion, for the purpose of confirming the accuracy of edge trimming, the state of the cutting blade, and so on. In the conventional cutting apparatus, however, a plurality of sensors are mounted for acquiring such kinds of information, which leads to a complicated structure and makes it difficult to reduce cost.

It is therefore an object of the present invention to provide a cutting apparatus which is simple in structure and is able to acquire various kinds of information, and a wafer processing method using the cutting apparatus.

In accordance with an aspect of the present invention, there is provided a cutting apparatus including a chuck table that holds by a holding surface a wafer chamfered at a peripheral portion and that is rotatable, a cutting unit that cuts the peripheral portion of the wafer held on the chuck table from a front surface side by a cutting blade mounted to a spindle, to form on the front surface side of the wafer an annular stepped portion along the peripheral portion, a line sensor unit that applies a laser beam in a band shape elongate in a radial direction of the wafer to a region inclusive of the peripheral portion of the wafer held on the chuck table, and detects reflected light of the laser beam reflected on the region, and an information calculation section that calculates a position of the wafer and a height of the front surface of the wafer from the reflected light of the laser beam detected by the line sensor unit in a state in which the chuck table is rotated before the wafer is cut to form the stepped portion, and that calculates the width and the height of the stepped portion from the reflected light of the laser beam detected by the line sensor unit after the wafer is cut to form the stepped portion.

In a mode of the present invention, preferably, the cutting apparatus further includes a threshold comparison section that compares the width and the height of the stepped portion calculated by the information calculation section with thresholds for the width and the height of the stepped portion, and that determines whether or not consumption amount and a change in shape of a tip of the cutting blade are within allowable ranges.

In another mode of the present invention, there is provided a wafer processing method for processing a wafer provided on a front surface side with a device region formed with devices and a peripheral marginal region surrounding the device region, the wafer chamfered at a peripheral portion thereof, by use of the aforementioned cutting apparatus. The wafer processing method includes a holding step of holding a back surface side of the wafer by the chuck table, a first calculation step of applying the laser beam to the region inclusive of the peripheral portion of the wafer held on the chuck table in a state in which the chuck table is rotated, and calculating a position of the wafer and a height of the front surface of the wafer from the reflected light of the laser beam reflected on the region, and a stepped portion forming step of causing the cutting blade to cut into the wafer from the front surface side of the peripheral portion, based on the position of the wafer and the height of the front surface of the wafer calculated in the first calculation step, to form the peripheral portion with the stepped portion having a predetermined width and a predetermined depth.

In another mode of the present invention, preferably, the wafer processing method further includes, after the stepped portion forming step, a second calculation step of applying the laser beam to the region inclusive of the peripheral portion of the wafer held on the chuck table, to calculate a width and a height of the stepped portion from the reflected light of the laser beam reflected on the region, and a determination step of comparing the width and the height of the stepped portion calculated in the second calculation step with thresholds for the width and the height of the stepped portion, to determine whether or not consumption amount and a change in shape of a tip of the cutting blade are within allowable ranges.

The cutting apparatus according to a mode of the present invention includes the line sensor unit that applies the laser beam in the band shape elongate in a radial direction of the wafer to a region inclusive of a peripheral portion of the wafer held by the chuck table and that detects reflected light of the laser beam reflected on the region, and the information calculation section that calculates the position of the wafer and the height of the front surface of the wafer and calculates the width and the height of the stepped portion, from the reflected light of the laser beam detected by the line sensor unit. Therefore, it is unnecessary to mount a plurality of sensors for the purpose of calculating the position of the wafer and the height of the front surface of the wafer and calculating the width and the height of the stepped portion. In this way, according to the present invention, it is possible to provide a cutting apparatus which is simple in structure and which is able to acquire various kinds of information.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
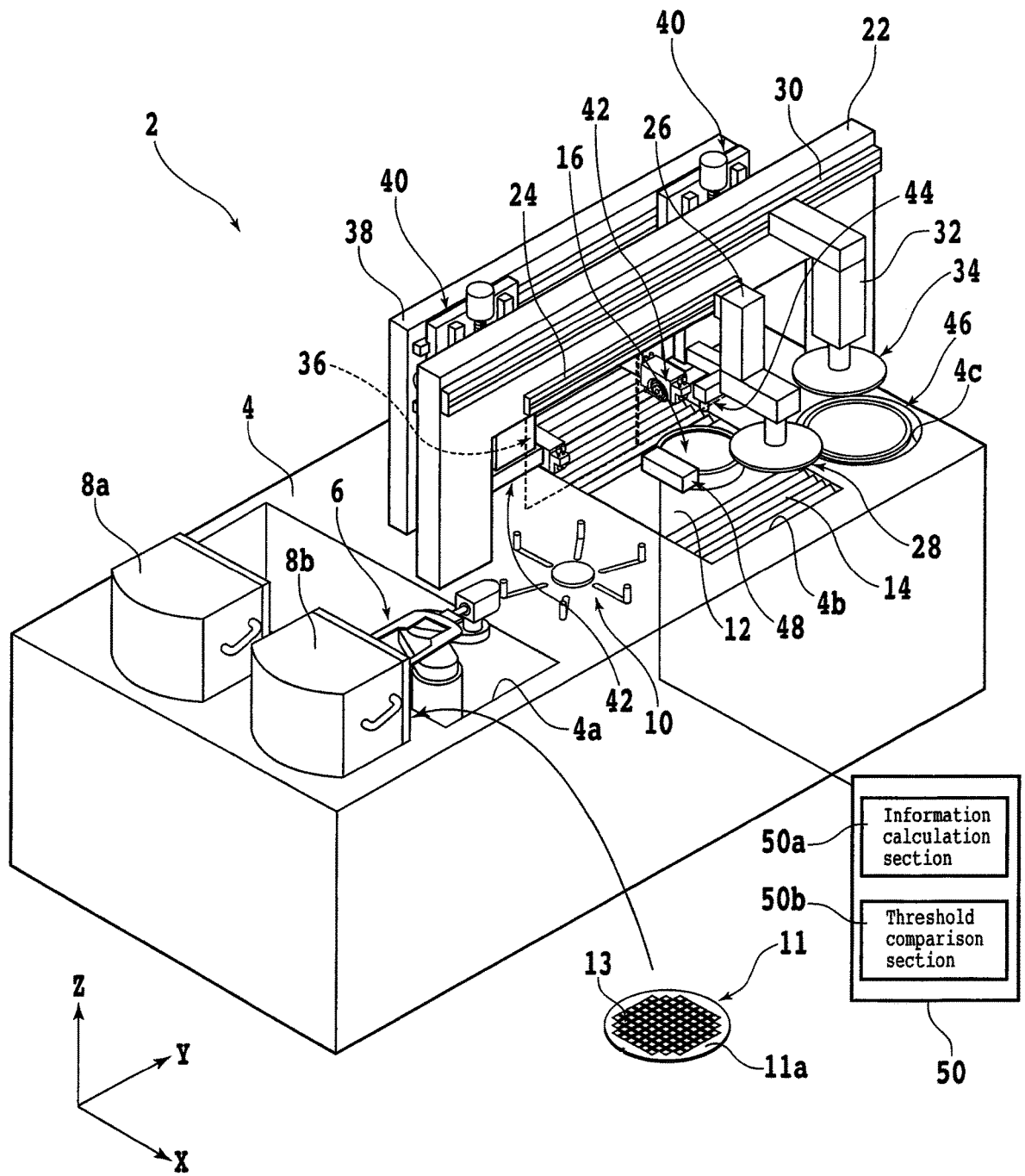
FIG. 1 is a perspective view depicting schematically a configuration example of a cutting apparatus.

An embodiment according to one mode of the present invention will be described referring to the attached drawings. FIG. 1 is a perspective view depicting schematically a configuration example of a cutting apparatus 2 according to the present embodiment. As depicted in FIG. 1, the cutting apparatus 2 has a base 4 that supports each structure. An upper surface of the base 4 is formed with an opening 4a in the shape of a rectangle elongate in an X-axis direction (a front-rear direction, a processing feed direction) in plan view, and a first carrying unit 6 that carries a wafer 11 as an object to be processed is disposed in the opening 4a.

The wafer 11 is formed in a disk-like shape from a semiconductor material such as silicon, for example, and its front surface 11a side is divided into a device region on a central side and a peripheral marginal region surrounding the device region. The device region is further partitioned into a plurality of regions by division lines (streets) arranged in a grid pattern, and a device 13 such as an IC is formed in each of the regions. In addition, a peripheral portion 11c (see FIG. 2A and the like) of the wafer 11 is chamfered. Note that while the disk-shaped wafer 11 formed of a semiconductor material such as silicon is used in the present embodiment, there are no limitations as to the material, shape, structure, size or the like of the wafer. For example, a wafer formed of other material such as semiconductor, ceramic, resin, or metal can also be used. In addition, there are also no limitations as to the kind, number, shape, structure, size, layout or the like of the device or devices.

Cassettes 8a and 8b that accommodate wafers 11 are placed in an area on one side of the opening 4a in regard of a Y-axis direction (a left-right direction, an indexing feed direction). A centering table 10 is disposed in an area on the opposite side of the opening 4a from the region where the cassettes 8a and 8b are mounted. The centering table 10 adjusts, for example, the position of the center of the wafer 11 carried from the cassettes 8a and 8b by the first carrying unit 6. In an area on a further lateral side (on the opposite side of the opening 4a) than the centering table 10, there is formed an opening 4b in the shape of a rectangle elongate in the X-axis direction in plan view. An X-axis moving table 12, an X-axis moving mechanism (not depicted) that moves the X-axis moving table 12 in the X-axis direction, and a dustproof and droplet-proof cover 14 covering the X-axis moving mechanism are provided in the opening 4b.

The X-axis moving mechanism includes a pair of X-axis guide rails (not depicted) parallel to the X-axis direction, and the X-axis moving table 12 is slidably mounted to the X-axis guide rails. A nut section (not depicted) is provided on a lower surface side of the X-axis moving table 12, and an X-axis ball screw (not depicted) parallel to the X-axis guide rails is in screw engagement with the nut section. An X-axis pulse motor (not depicted) is coupled to one end portion of the X-axis ball screw. With the X-axis ball screw rotated by the X-axis pulse motor, the X-axis moving table 12 is moved in the X-axis direction along the X-axis guide rails.

A chuck table 16 for holding the wafer 11 is provided on the upper side of the X-axis moving table 12. The chuck table 16 is coupled to a rotational drive source (not depicted) such as a motor, and is rotated about a rotational axis substantially parallel to a Z-axis direction (vertical direction). In addition, the chuck table 16 is moved between a carrying-in/out region on a front side and a processing region on a rear side by the aforementioned X-axis moving mechanism. Part (peripheral part) of an upper surface of the chuck table 16 is a holding surface 16a (see FIG. 2A and the like) that holds the wafer 11 by suction. The holding surface 16a is connected to a suction source 20 (see FIG. 2A and the like) through a suction passage 16b (see FIG. 2A and the like) formed inside the chuck table 16, a valve 18 (see FIG. 2A and the like) and the like.

A first support structure 22 in a gate form straddling the opening 4b in the Y-axis direction is disposed on the upper surface of the base 4. A first rail 24 substantially parallel to the Y-axis direction is provided on a front surface of the first support structure 22, and a second carrying unit 28 is mounted to the first rail 24 through a first lift unit 26.

The second carrying unit 28 is moved in the Y-axis direction along the first rail 24, and is moved in the Z-axis direction by the first lift unit 26. By the second carrying unit 28, it is possible, for example, to receive the wafer 11 from the centering table 10 or the chuck table 16, and to transfer the wafer 11 to the centering table 10 or the chuck table 16. In other words, the wafer 11 on the centering table 10 can be held by the second carrying unit 28 and can be carried in to the chuck table 16. In addition, by the second carrying unit 28, the wafer 11 can be carried out from the chuck table 16, and the wafer 11 can be transferred onto the centering table 10.

A second rail 30 substantially parallel to the Y-axis direction is provided on the upper side of the first rail 24, and a third carrying unit 34 is mounted to the second rail 30 through a second lift unit 32. The second carrying unit 34 is moved in the Y-axis direction along the second rail 30, and is moved in the Z-axis direction by the second lift unit 32.

A second support structure 38 in a gate form is disposed on the rear side of the first support structure 22, through a shutter 36 that partitions the carrying-in/out region and the processing region. Two sets of cutting units 42 are provided on a front surface of the second support structure 38, through moving units 40, individually. The cutting units 42 are moved in the Y-axis direction and the Z-axis direction by the moving units 40.

Each of the cutting units 42 has a spindle (not depicted) serving as a rotational axis substantially parallel to the Y-axis direction. An annular cutting blade is mounted to one end side of the spindle. A rotational drive source (not depicted) such as a motor is connected to the other end side of the spindle, and the cutting blade is rotated by a force transmitted from the rotational drive source.

An imaging unit 44 for imaging the wafer 11 held by the chuck table 16 and the like is provided at a position adjacent to the cutting unit 42. The imaging unit 44 is used, for example, in alignment for adjusting the orientation of the division lines of the wafer 11, and is moved in the Y-axis direction and the Z-axis direction together with the cutting unit 42 by the moving unit 40.

An opening 4c which is circular in plan view is formed at a position on the opposite side of the opening 4b from the centering table 10. A cleaning unit 46 for cleaning the wafer 11 after processing is disposed in the opening 4c. The wafer 11 processed by the cutting unit 42 is carried to the cleaning unit 46 by the third carrying unit 34. The wafer 11 cleaned by the cleaning unit 46 is placed onto the centering table 10 by the second carrying unit 28, and is thereafter accommodated into the cassette 8a or 8b by the first carrying unit 6.

A line sensor unit 48 that applies a band-shaped (rectilinear) laser beam 48a (see FIG. 2A and the like) and detects reflected light of the laser beam 48a is provided in the carrying-in/out region of the cutting apparatus 2. Specifically, the line sensor unit 48 is disposed on an upper side of a peripheral portion of the chuck table 16 in a state in which the chuck table 16 is positioned in the carrying-in/out region. As a result of this, a laser beam 48a can be applied from the line sensor unit 48 toward the region inclusive of the peripheral portion 11c of the wafer 11 held by the chuck table 16, and reflected light of the laser beam 48a reflected on the region can be detected. Note that the line sensor unit 48 is disposed in such an orientation that the laser beam 48a elongated in a radial direction of the wafer 11 can be applied, and that the reflected lights reflected at a plurality of positions along the radial direction can be detected at a time.

A processor unit 50 is connected to the line sensor unit 48. The processor unit 50 includes, for example, an information calculation section 50a that calculates such information as position, height and size from data (the results of detection of the reflected light) obtained by the line sensor unit 48, and a threshold comparison section 50b that compares the information calculated by the information calculation section 50a with thresholds. The details of the functions possessed by the information calculation section 50a and the threshold comparison section 50b will be described later.

Now, an example of a wafer processing method conducted using the aforementioned cutting apparatus 2 will be described below. In the wafer processing method according to the present embodiment, first, a holding step of holding a back surface 11b side of the wafer 11 by the chuck table 16 of the cutting apparatus 2 is conducted. Specifically, for example, the wafer 11 the position of the center of which has been adjusted by the centering table 10 is carried in to the chuck table 16 by the second carrying unit 28. More in detail, the back surface 11b side of the wafer 11 is put in close contact with the holding surface 16a of the chuck table 16, such that the front surface 11a side of the wafer 11 is exposed to the upper side. Then, the valve 18 is opened, whereby a negative pressure of the suction source 20 is made to act on the back surface 11b side of the wafer 11. As a result of this, the back surface 11b side of the wafer 11 can be held by the chuck table 16.

Figure 2A:
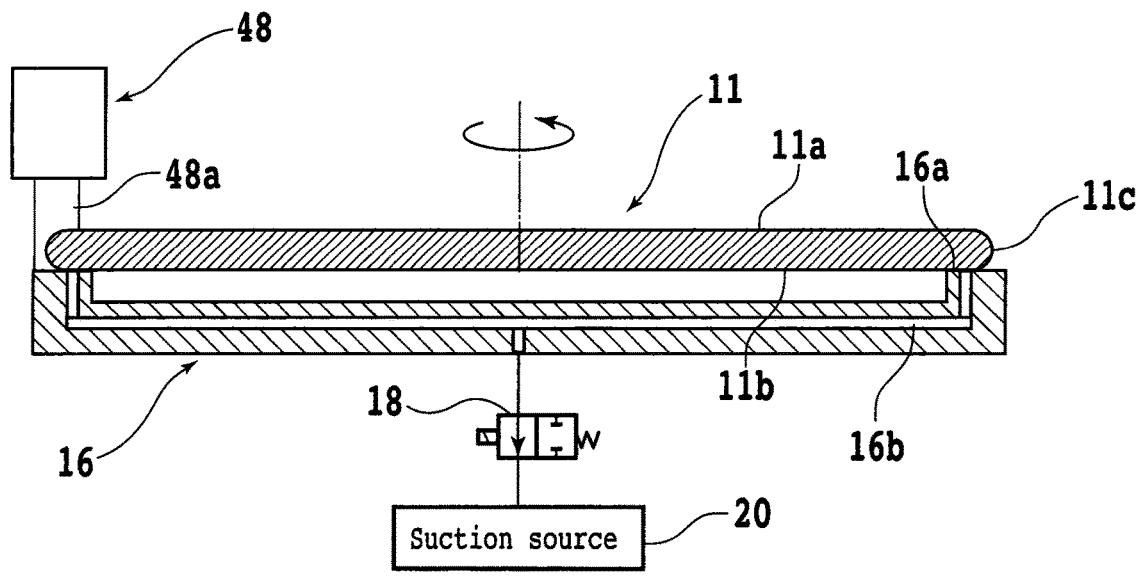
FIG. 2A is a sectional view depicting schematically the manner in which a laser beam is applied to a wafer from a line sensor unit before processing.
Figure 2B:
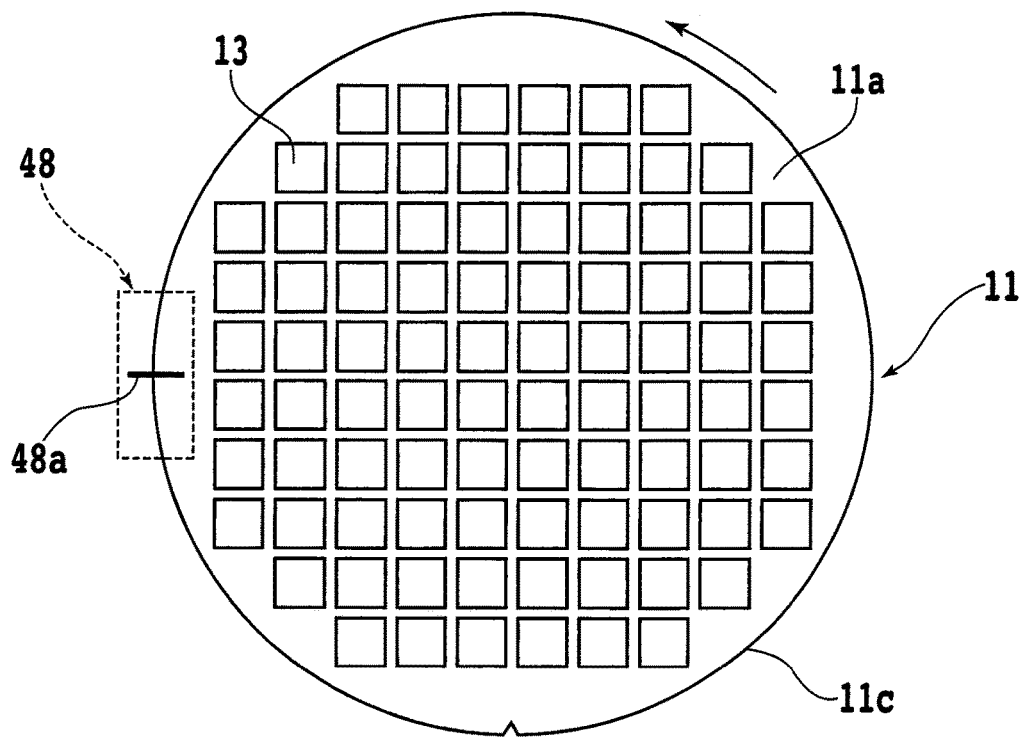
FIG. 2B is a plan view depicting schematically the manner in which the laser beam is applied to the wafer from the line sensor unit before processing.

After the holding step, a first calculation step of calculating the position of the wafer 11 relative to the chuck table 16 and the height of the peripheral portion 11c on the front surface 11a side is performed. FIG. 2A is a sectional view depicting schematically the manner in which the laser beam 48a is applied to the wafer 11 from the line sensor unit 48, and FIG. 2B is a plan view depicting schematically the manner in which the laser beam 48a is applied to the wafer 11 from the line sensor unit 48. Note that in FIG. 2A, some of components are depicted in the form of a functional block or the like. As depicted in FIGS. 2A and 2B, in the first calculation step, first, the chuck table 16 is rotated into an arbitrary orientation. In this state, the laser beam 48a in a band shape elongate in a radial direction of the wafer 11 is applied from the line sensor unit 48 toward the region inclusive of the peripheral portion 11c of the wafer 11. Then, the reflected light of the laser beam 48a reflected on the front surface 11a side of the wafer 11 is detected by the line sensor unit 48.

Figure 3A:
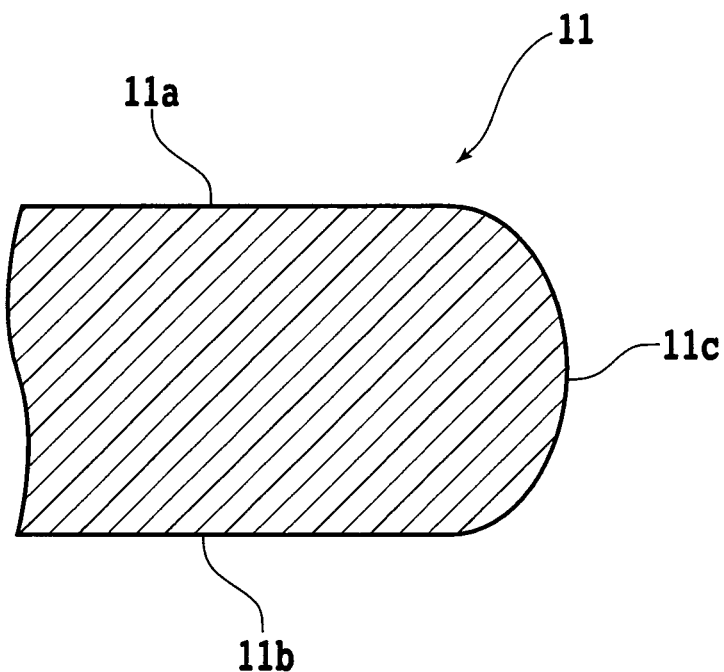
FIG. 3A is a sectional view depicting in an enlarged form a region of the wafer to which the laser beam is applied before processing.
Figure 3B:
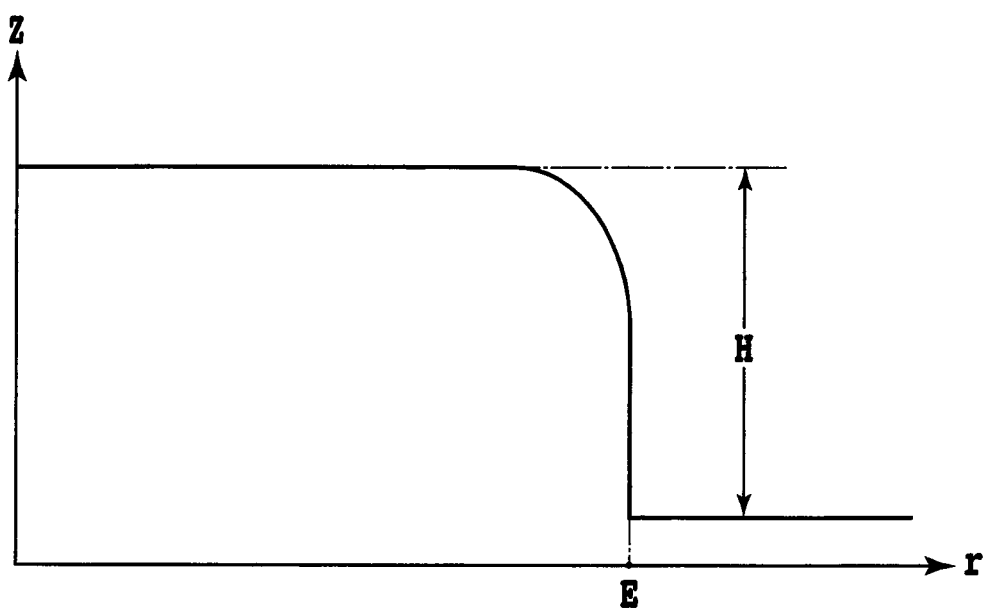
FIG. 3B is a graph depicting schematically the results of detection of reflected light obtained by a line sensor unit.

FIG. 3A is a sectional view depicting, in an enlarged form, a region of the wafer 11 to which the laser beam 48a is applied, and FIG. 3B is a graph depicting schematically the results of detection of the reflected light obtained by the line sensor unit 48. Note that in the graph of FIG. 3B, the axis of abscissas represents the position (r) in a radial direction of the wafer 11, and the axis of ordinates represents height (Z). For example, when the reflected light of the laser beam 48a applied to the region depicted in FIG. 3A is detected by the line sensor unit 48, a graph as depicted in FIG. 3B is obtained. In this graph, E corresponds to the position of a peripheral edge of the wafer 11, and H corresponds to the height from the holding surface 16a of the chuck table 16 to the front surface 11a of the wafer 11 (namely, the thickness of the wafer 11). The information calculation section 50a of the processor unit 50 calculates the position of the peripheral edge of the wafer 11 and the height of the front surface 11a of the wafer 11, from H and E in the graph.

In the present embodiment, the reflected light of the laser beam 48a is detected by the line sensor unit 48 while rotating the chuck table 16; therefore, the graphs as depicted in FIG. 3B are obtained correspondingly to a plurality of regions of the peripheral portion 11c. In other words, the information calculation section 50a can calculate the position of the peripheral edge and the height of the front surface 11a in the plurality of regions of the wafer 11. As a result, the positions of the profile of the wafer 11 become clear.

Further, the information calculation section 50a may calculate the position of the center of the wafer 11, based on the information on the positions of the peripheral edge (the information on the positions of the profile) obtained from the plurality of regions of the wafer 11. When the position of the wafer 11 and the height of the front surface 11a of the wafer 11 are thus calculated, the first calculation step is finished.

After the first calculation step, a stepped portion forming step of partly cutting and removing the peripheral portion 11c of the wafer 11 to form an annular stepped portion is carried out. Specifically, first, the chuck table 16 with the wafer 11 held thereon and the cutting unit 42 are relatively moved, to align the cutting blade to a position where the stepped portion is to be formed. Here, the position of the cutting blade (the position at which the cutting blade is made to cut into the wafer 11) is determined based on the position of the wafer 11 calculated in the first calculation step in such a manner that an annular stepped portion with a predetermined width can be formed at the peripheral portion 11c. Next, a lower end of the cutting blade is lowered to a position below the front surface 11a of the wafer 11. Simultaneously, the chuck table 16 is rotated. Here, the height of the cutting blade (the depth to which the cutting blade is made to cut into the wafer 11) is determined based on the height of the front surface 11a of the wafer 11 calculated in the first calculation step in such a manner that an annular stepped portion with a predetermined depth can be formed at the peripheral portion 11c.

For instance, in the case where the height of the front surface 11a of the wafer 11 calculated in the first calculation step varies in the circumferential direction, it is recommendable to vary the height of the cutting blade (the depth to which the cutting blade is made to cut into the wafer 11) according to the rotation of the chuck table 16, taking into account the height of the front surface 11a of the wafer 11. In addition, in the case where the positions of the profile of the wafer 11 calculated in the first calculation step are deviated from a reference range of the chuck table 16 (in the case where the center of the wafer 11 is deemed not to be in register with the rotational axis of the chuck table 16), it is recommendable to move the cutting unit 42 in the Y-axis direction in accordance with the rotation of the chuck table 16. As a result of this, the cutting blade can be made to cut into the peripheral portion 11c of the wafer 11 from the front surface 11a side of the wafer 11, to partly cut and remove the peripheral portion 11c from the front surface 11a side, and thereby to form an annular stepped portion 11d (see FIG. 4A and the like) having a predetermined width and a predetermined depth. When the stepped portion 11d is formed, the stepped portion forming step is finished.

Figure 4A:
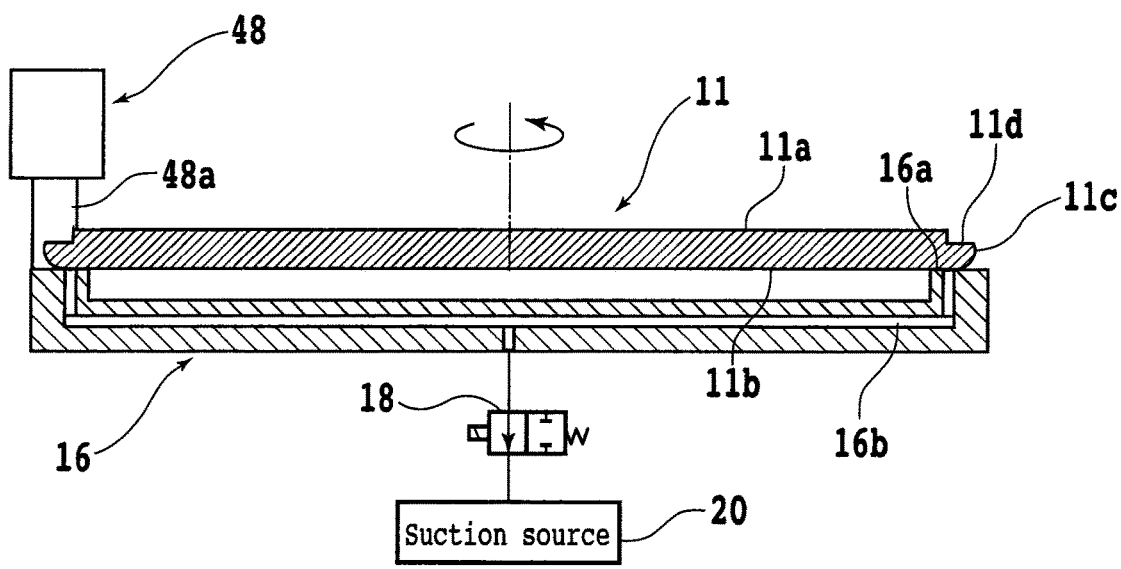
FIG. 4A is a sectional view depicting schematically the manner in which the laser beam is applied to the wafer from the line sensor unit after processing.
Figure 4B:
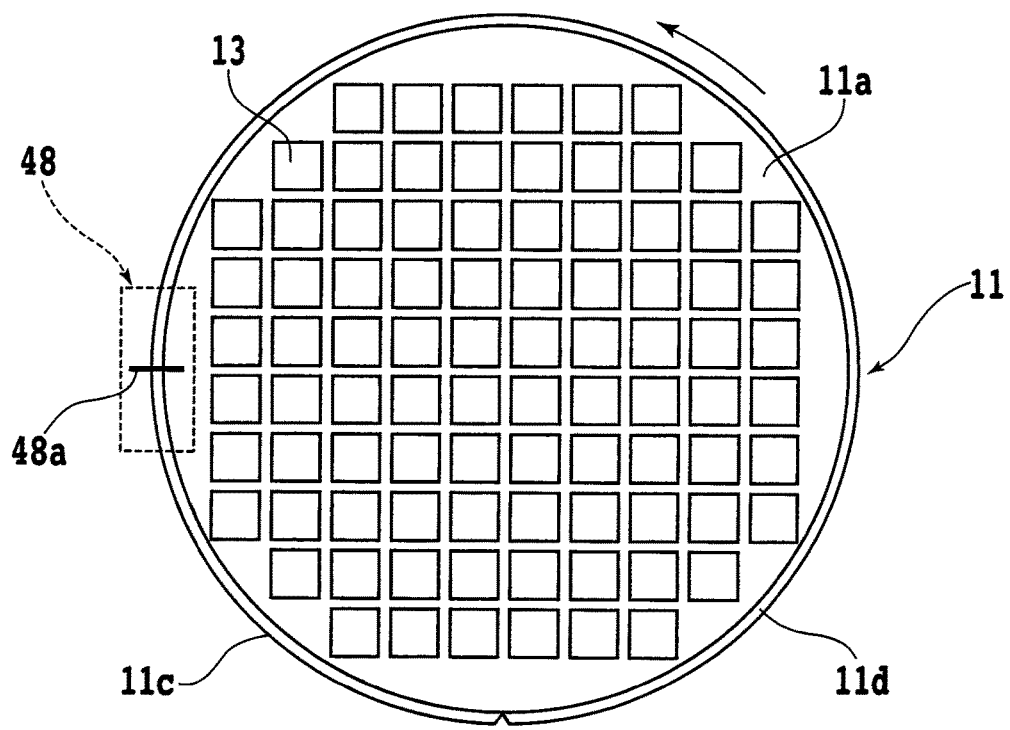
FIG. 4B is a plan view depicting schematically the manner in which the laser beam is applied to the wafer from the line sensor unit after processing.

After the stepped portion forming step, a second calculation step of calculating the width and the height of the stepped portion 11d (for example, the height from a bottom of the stepped portion 11d to the front surface 11a) is carried out. FIG. 4A is a sectional view depicting schematically the manner in which the laser beam 48a is applied to the wafer 11 from the line sensor unit 48, and FIG. 4B is a plan view depicting schematically the manner in which the laser beam 48a is applied to the wafer 11 from the line sensor unit 48. Note that in FIG. 4A, some of components are depicted in the form of a functional block or the like. As depicted in FIGS. 4A and 4B, in the second calculation step, first, the chuck table 16 is rotated into an arbitrary orientation. In this state, a laser beam 48a in a band-like shape elongate in a radial direction of the wafer 11 is applied from the line sensor unit 48 toward a region inclusive of the peripheral portion 11c (a region inclusive of the stepped portion 11d) of the wafer 11. Then, reflected light of the laser beam 48a reflected on the front surface 11a side of the wafer 11 is detected by the line sensor unit 48.

Figure 5A:
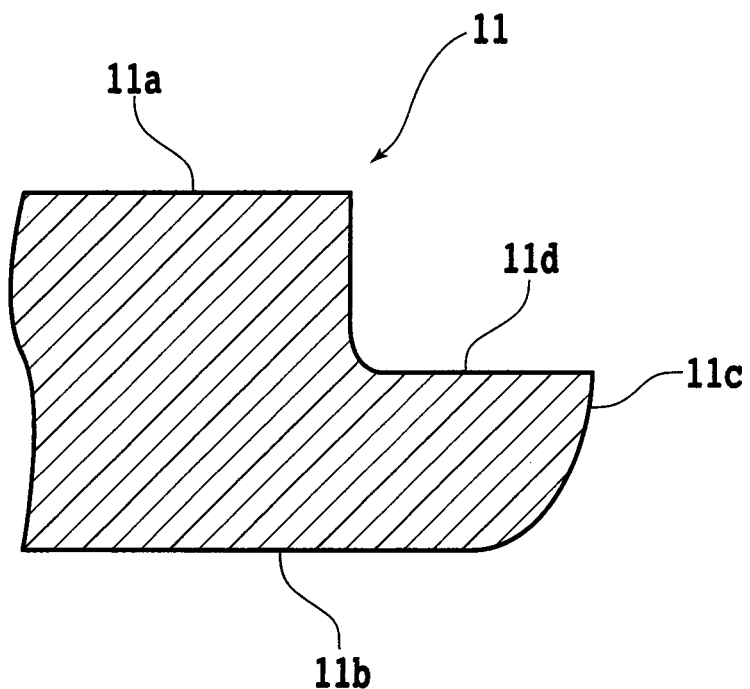
FIG. 5A is a sectional view depicting in an enlarged form a region of the wafer to which the laser beam is applied after processing.
Figure 5B:
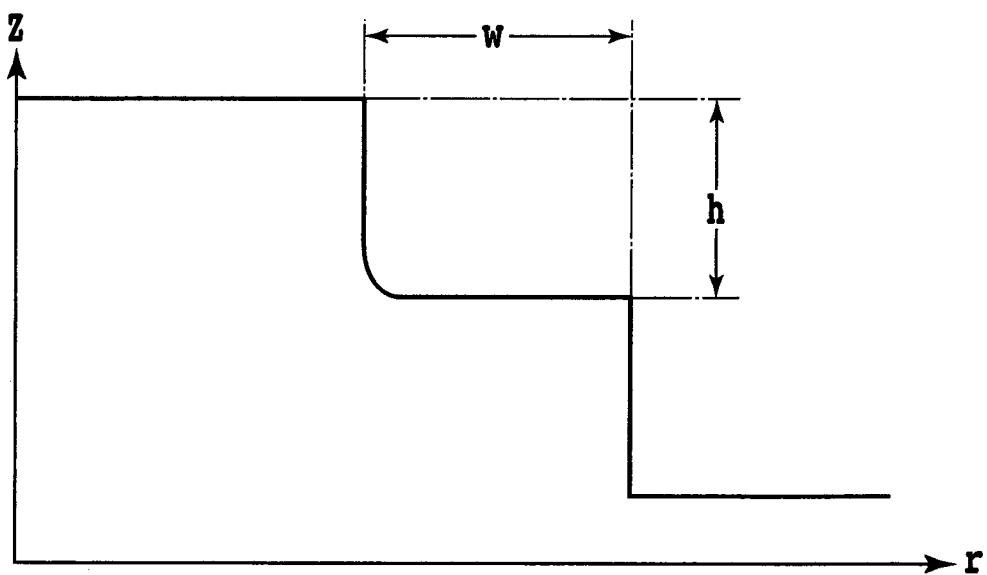
FIG. 5B is a graph depicting schematically the results of detection of reflected light reflected on the region depicted in FIG. 5A.

FIG. 5A is a sectional view depicting in an enlarged form a region of the wafer 11 to which the laser beam 48a is applied, and FIG. 5B is a graph depicting schematically the results of detection of the reflected light reflected on the region depicted in FIG. 5A. Note that in the graph of FIG. 5B, the axis of abscissas represents the position (r) in a radial direction of the wafer 11, and the axis of ordinates represents the height (Z). For example, when the reflected light of the laser beam 48a applied to the region depicted in FIG. 5A is detected by the line sensor unit 48, a graph as depicted in FIG. 5B is obtained. In this graph, w corresponds to the width of the stepped portion 11d, and h corresponds to the height of the stepped portion 11d (the height from the bottom of the stepped portion 11d to the front surface 11a). The information calculation section 50a of the processor unit 50 calculates the width and the height of the stepped portion 11d from w and h in the graph.

Figure 6A:
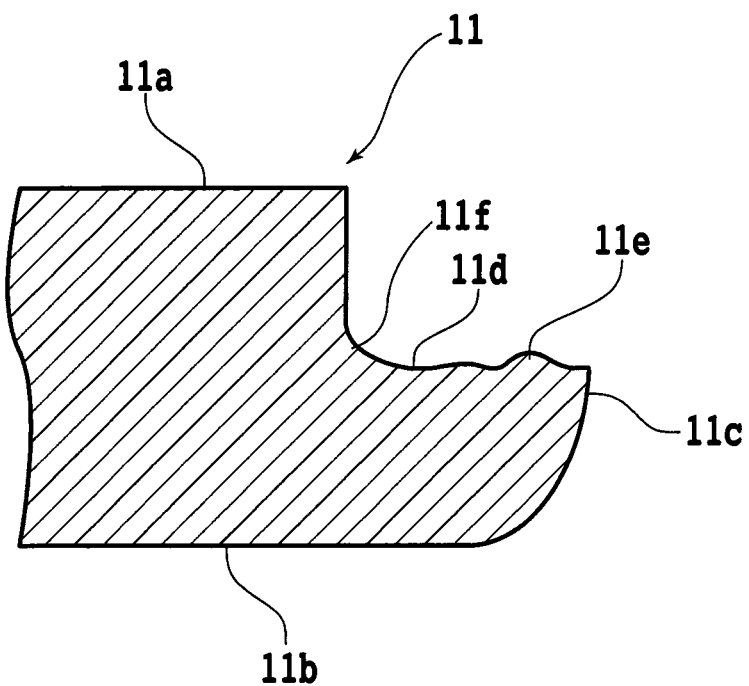
FIG. 6A is a sectional view depicting in an enlarged form another region of the wafer to which the laser beam is applied after processing.
Figure 6B:
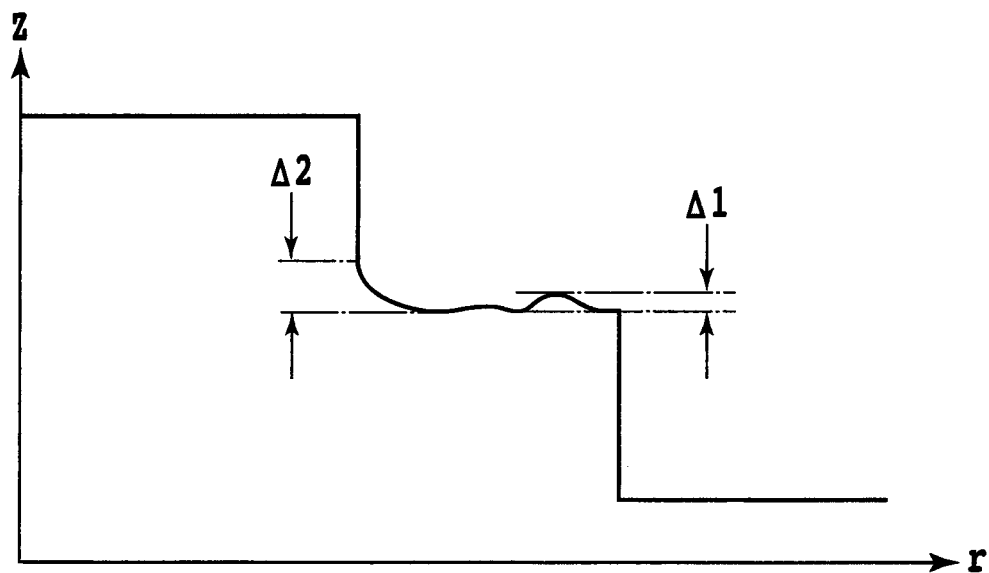
FIG. 6B is a graph depicting schematically the results of detection of reflected light reflected on the region depicted in FIG. 6A.

FIG. 6A is a sectional view depicting, in an enlarged form, another region of the wafer 11 to which the laser beam 48a is applied, and FIG. 6B is a graph depicting schematically the results of detection of the reflected light reflected on the region depicted in FIG. 6A. When the reflected light of the laser beam 48a applied to the region depicted in FIG. 6A is detected by the line sensor unit 48, a graph as depicted in FIG. 6B is obtained. In this graph, $\Delta 1$ corresponds to the height from the bottom of the stepped portion 11d to the top of a projection 11e. In this way, in the case where ruggedness (projections and recesses) is present at the bottom of the stepped portion 11d, it is desirable for the information calculation section 50a of the processor unit 50 to calculate $\Delta 1$ as the difference of elevation. Similarly, in the graph of FIG. 6B, $\Delta 2$ corresponds to the height from the bottom of the stepped portion 11d to the top of a corner portion 11f configured in a curved surface shape. In this way, in the case where the corner portion 11f of the stepped portion 11d is configured in a curved surface shape, it is desirable for the information calculation section 50a of the processor unit 50 to calculate $\Delta 2$ as the height of the corner portion 11f. When the width, height, and difference in elevation of the stepped portion 11d and the height of the corner portion 11f and the like are calculated, the second calculation step is finished.

After the second calculation step, a determination step is carried out in which thresholds for the width, height, and difference of elevation of the stepped portion 11d and the height of the corner portion 11f and the width, height, and difference of elevation of the stepped portion 11d and the height of the corner portion 11f that are calculated in the second calculation step are compared with each other, and it is determined whether or not consumption amount and a change in shape of a tip of the cutting blade and the like are within allowable ranges. Specifically, the threshold comparison section 50b of the processor unit 50 compares a threshold for the width of the stepped portion 11d, a threshold for the height of the stepped portion 11d, a threshold for the difference of elevation of the stepped portion 11d, and a threshold of the height of the corner portion 11f that are preliminarily set with the width, height, and difference of elevation of the stepped portion 11d and the height of the corner portion 11f that are calculated in the second calculation step.

Here, the threshold for the width of the stepped portion 11d and the threshold for the height of the stepped portion 11d are determined, for example, in accordance with allowable ranges of consumption amount and a change in shape of the tip of the cutting blade. In the case where the width and the height of the stepped portion 11*d* are not more than (are less than) the respective thresholds, the threshold comparison section 50*b* determines that the consumption amount and the change in shape of the tip of the cutting blade are not in allowable ranges. On the other hand, in the case where the width and the height of the stepped portion 11*d* are more than (are not less than) the respective thresholds, the threshold comparison section 50*b* determines that the consumption amount and the change in shape of the tip of the cutting blade are within allowable ranges.

Similarly, the threshold for difference of elevation of the stepped portion 11*d* and the threshold for the height of the corner portion 11*f* are determined, for example, in accordance with an allowable range of the change in shape of the tip of the cutting blade. In the case where the difference of elevation of the stepped portion 11*d* and the height of the corner portion 11*f* are not more than (are less than) the respective thresholds, the threshold comparison section 50*b* determines that the change in shape of the tip of the cutting blade is within the allowable range. On the other hand, in the case where the difference of elevation of the stepped portion 11*d* and the height of the corner portion 11*f* are more than (are not less than) the respective thresholds, the threshold comparison section 50*b* determines that the change in shape of the tip of the cutting blade are not within the allowable ranges. Note that in the case where the height of the corner portion 11*f* is more than (is not less than) the threshold, there is a problem that grinding of the wafer causes an edge to be processed in an eaves-like shape and be susceptible to chipping.

An operator is informed of the results of the determination step by such a method as display on a monitor (not depicted) or the like, turning ON (blinking) of an alarm lamp, or generation of an alarm sound. The operator can appropriately carry out such a process as replacement of the cutting blade, based on the results of determination in the determination step. Further, the cutting apparatus 2 may be configured so that the height, the position in the Y-axis direction and the like of the cutting blade can be automatically adjusted based on the results of the determination step. By this adjustment, it is possible to again process the wafer 11 as an object of determination, or to successively process another wafer 11.

As has been described above, the cutting apparatus 2 of the present embodiment includes the line sensor unit 48 that applies the laser beam 48*a* in a band-like shape elongated in a radial direction of the wafer 11 to the region inclusive of the peripheral portion 11*c* of the wafer 11 held on the chuck table 16 and detects the reflected light of the laser beam reflected on the region. The cutting apparatus 2 of the present embodiment further includes the information calculation section 50*a* that calculates the position of the wafer 11 and the height of the front surface 11*a* of the wafer 11, and calculates the width and the height of the stepped portion 11*d*, from the reflected light of the laser beam 48*a* detected by the line sensor unit 48. Therefore, it is unnecessary to mount a plurality of sensors for calculating the height of the position of the wafer 11 and the height of the front surface 11*a* of the wafer 11 as well as the width and the height of the stepped portion 11*d*.

In addition, in the cutting apparatus 2 of the present embodiment, use is made of the line sensor unit 48 by which the reflected lights reflected at a plurality of positions can be detected at a time. Therefore, the time required for calculation of the position of the wafer 11, the height of the front surface 11*a* of the wafer 11 as well as the width and the height of the stepped portion 11*d* can be shortened, as compared to the cases where other sensor and/or other method is used.

Further, the cutting apparatus 2 of the present embodiment further includes the threshold comparison section 50*b* that compares the width and the height of the stepped portion 11*d* calculated by the information calculation section 50*a* with the thresholds for the width and the height of the stepped portion 11*d*, and determines whether or not the consumption amount and the change in shape of the tip of the cutting blade are within allowable ranges. Therefore, it is possible to appropriately determine whether or not the consumption amount and the change in shape of the tip of the cutting blade are within the allowable ranges, and to appropriately carry out such a process as replacement of the cutting blade.

Note that the present invention is not limited to the description of the above embodiment, but can be carried out with various modifications. For instance, in the wafer processing method according to the present embodiment, in the case where the positions of the profile of the wafer 11 calculated in the first calculation step are deviated from a reference range of the chuck table 16, the cutting unit 42 is moved in the Y-axis direction in accordance with the rotation of the chuck table 16 in the subsequent stepped portion forming step. However, such a movement of the cutting unit 42 can be omitted, for example, if the wafer 11 is re-carried into the correct position on the chuck table 16 by the second carrying unit 28 before the stepped portion forming step.

In addition, in the wafer processing method according to the present embodiment, the chuck table 16 is rotated in the second calculation step. However, the chuck table 16 may not necessarily be rotated in the second calculation step. In this case, the width, height, and difference of elevation of the stepped portion 11*d* as well as the height of the corner portion 11*f* and the like are calculated in regard of one region of the peripheral portion 11*c*.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A wafer processing method for processing a wafer provided on a front surface side of the wafer with a device region formed with devices and a peripheral marginal region surrounding the device region, the wafer chamfered at a peripheral portion thereof, by use of a cutting apparatus including a chuck table that holds by a holding surface the wafer chamfered at the peripheral portion and that is rotatable, a cutting unit that cuts the chamfered peripheral portion of the wafer held on the chuck table from the front surface side of the wafer by a cutting blade mounted to a spindle, to form on the front surface side of the wafer an annular stepped portion along the chamfered peripheral portion, a line sensor unit that applies a laser beam in a band shape elongating in a radial direction of the wafer to a region of the wafer inclusive of the chamfered peripheral portion of the wafer held on the chuck table, and detects reflected light of the laser beam reflected on the region of the wafer, and an information calculation section that calculates a position of the wafer and a height of the front surface side of the wafer from the reflected light of the laser beam detected by the line sensor unit in a state in which the chuck table is rotated before the wafer is cut to form the stepped portion, and that calculates a width and a height of the stepped portion from the reflected light of the laser beam detected by the line sensor unit after the wafer is cut to form the stepped portion, the wafer processing method comprising:

a holding step of holding a back surface side of the wafer by the chuck table;

a first calculation step of applying the laser beam to the region of the wafer inclusive of the chamfered peripheral portion of the wafer held on the chuck table in the state in which the chuck table is rotated, and calculating the position of the wafer and the height of the front surface side of the wafer from the reflected light of the laser beam reflected on the region of the wafer; and a stepped portion forming step of causing the cutting blade to cut into the chamfered peripheral portion of the wafer from the front surface side of the wafer, based on the position of the wafer and the height of the front surface side of the wafer calculated in the first calculation step, to form the chamfered peripheral portion with the stepped portion having a predetermined width and a predetermined depth.

2. The wafer processing method according to claim 1, further comprising:

after the stepped portion forming step, a second calculation step of applying the laser beam to the region of the wafer inclusive of the chamfered peripheral portion of the wafer held on the chuck table, to calculate the width and the height of the stepped portion from the reflected light of the laser beam reflected on the region of the wafer; and a determination step of comparing the width and the height of the stepped portion calculated in the second calculation step with thresholds for the width and the height of the stepped portion, to determine whether or not consumption amount and a change in shape of a tip of the cutting blade are within allowable ranges.

3. The wafer processing method according to claim 2, wherein the cutting apparatus further includes a threshold comparison section that compares the width and the height of the stepped portion calculated in the second calculation step by the information calculation section with the thresholds for the width and the height of the stepped portion, to determine whether or not the consumption amount and the change in shape of the tip of the cutting blade are within the allowable ranges.

* * * * *